(12) United States Patent
von Ammon et al.

(10) Patent No.: US 6,171,395 B1
(45) Date of Patent: Jan. 9, 2001

(54) PROCESS AND HEATING DEVICE FOR MELTING SEMICONDUCTOR MATERIAL

(75) Inventors: Wilfried von Ammon, Ach (AT); Erich Tomzig, Burgkirchen (DE); Paul Fuchs, Schalchen (AT)

(73) Assignee: Wacker Siltronic Gesellschaft für Halbleitermaterialien AG, Burghausen (DE)

( * ) Notice: Under 35 U.S.C. 154(b), the term of this patent shall be extended for 0 days.

(21) Appl. No.: 09/203,266

(22) Filed: Dec. 1, 1998

(30) Foreign Application Priority Data

Dec. 2, 1997 (DE) .............................................. 197 53 477

(51) Int. Cl.[7] .................................................. C30B 28/14
(52) U.S. Cl. ............................ 117/200; 117/204; 117/217
(58) Field of Search ................................ 117/3, 7, 48, 60, 117/204, 220, 30, 15, 13, 217, 200

(56) References Cited

U.S. PATENT DOCUMENTS

| 3,716,345 | * | 2/1973 | Grabmaier | 117/31 |
|---|---|---|---|---|
| 5,363,796 | * | 11/1994 | Kobayashi et al. | 117/30 |
| 5,402,747 | * | 4/1995 | Kobayashi et al. | 117/15 |
| 5,443,034 | | 8/1995 | Evetts . | |
| 5,450,814 | * | 9/1995 | Shiraishi et al. | 117/217 |
| 5,683,504 | * | 11/1997 | Izunome et al. | 117/13 |
| 5,690,731 | * | 11/1997 | Kurata et al. | 117/13 |
| 5,792,255 | * | 8/1998 | Iino et al. | 117/32 |
| 5,846,322 | * | 12/1998 | Schulmann et al. | 117/216 |
| 5,871,578 | * | 2/1999 | Iino | 117/13 |
| 5,913,974 | * | 1/1999 | Habuka | 117/3 |

OTHER PUBLICATIONS

Patent Abstracts of Japan, vol. 015, No. 456 (C–o886); Nov. 20, 1991 & JP 03 193694 A (Sumimoto Metal Ind Ltd), Aug. 23, 1991.*
Patent Abstracts of Japan, vol. 015, vol. 456 (C–0886), Nov. 20, 1991 & JP 03 193694 A (Sumitomo Metal Ind Ltd), Aug. 23, 1991.
Patent Abstracts of Japan, vol. 098, vol. 002, Jan. 30, 1998, & JP 09 263 48 A (Sumitomo Sitix Corp), Oct. 7, 1997.
Patent Abstracts of Japan, vol. 098, vol. 001, Jan. 30, 1998 & JP 09235/175 A(Suitomom Sitix Corp.), Sept. 9, 1997.
Patent Abstracts of Japan, vol. 098, vol. 001, Jan. 30, 1998 & JP 09 227276A (Suitomo Sitix Corp), Sep. 2, 1997.
Patent Abstracts of Japan, vol. 016, No. 479, Sep. 30, 1992, & JP 04 170 388A (Nec Corp), Jun. 18, 1992.

* cited by examiner

Primary Examiner—Benjamin L. Utech
Assistant Examiner—Vanessa Perez
(74) Attorney, Agent, or Firm—Collard & Roe, P.C.

(57) ABSTRACT

The invention relates to a process for melting semiconductor material in a crucible which is located in a container, and is enclosed by a fixed heating device. The invention also relates to a heating device which is suitable for carrying out the process. The process is one wherein a heater of a displaceable heating device is lowered from a lock chamber above the container through an open shut-off valve into the container in the direction of the semiconductor material, and the semiconductor material is melted using the fixed heating device and the lowered heater. The heater is then raised back out of the container into the lock chamber after the semiconductor material has been melted. A door is provided in the lock chamber to allow the displaceable heater to be removed after the semiconductor material has been melted.

3 Claims, 1 Drawing Sheet

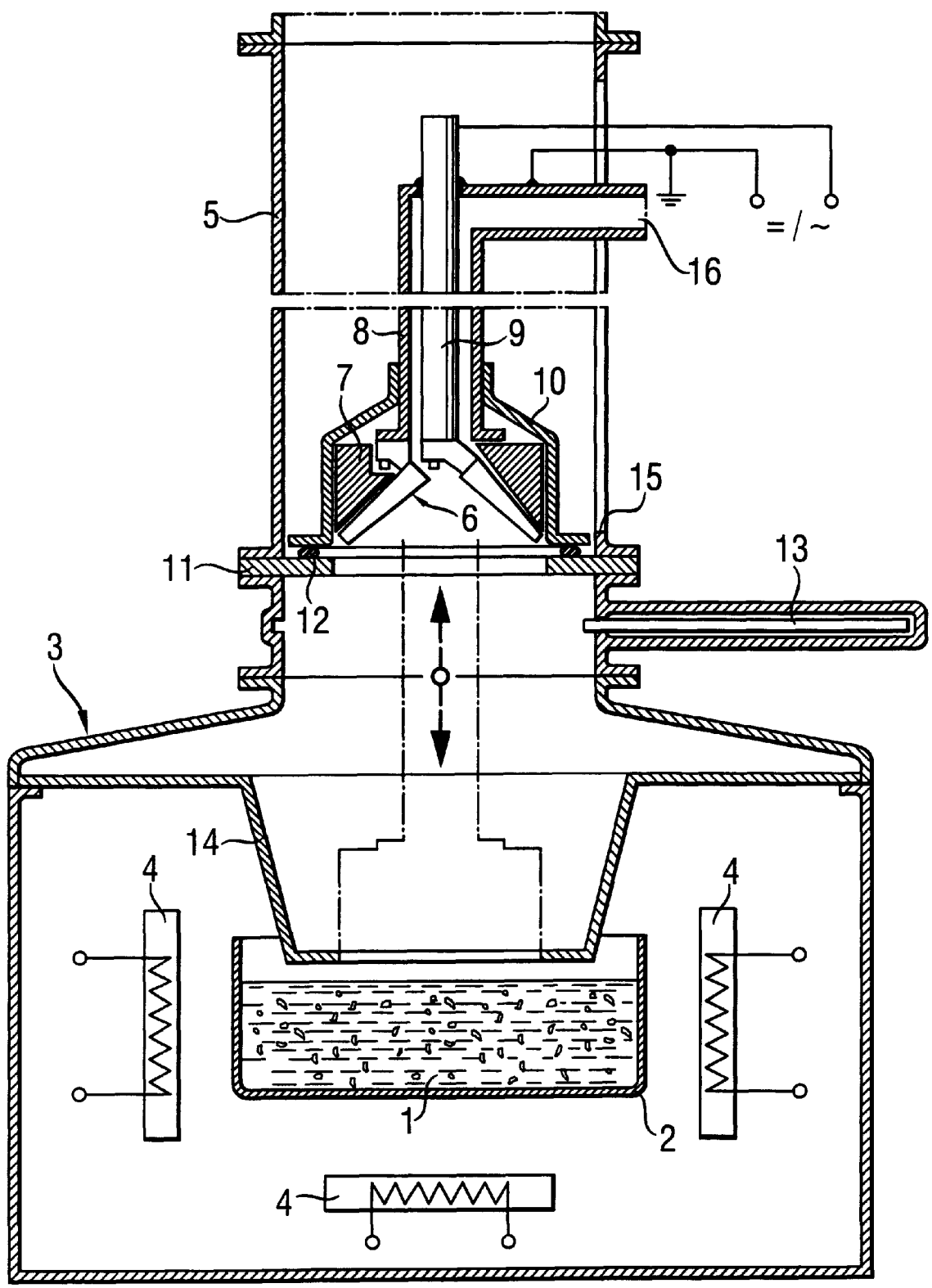

PROCESS AND HEATING DEVICE FOR MELTING SEMICONDUCTOR MATERIAL

BACKGROUND OF THE INVENTION

Field of the Invention

The present invention relates to a process for melting semiconductor material in a crucible that is located in a container. The invention also relates to a heating device that is suitable for carrying out the process.

The process is preferably used for the production of single crystals using the Czochralski method. In order for it to be possible for a single crystal to be pulled from a melt using this method, it is first necessary to melt the semiconductor material, which is customarily placed in a silicon crucible. The energy needed for this step is usually applied by a fixed heating device which is arranged around the crucible.

During the melting procedure, the crucible is exposed to a high temperature. As a result, so-called pitting corrosion of the crucible material takes place. This leads to the production of particles which may subsequently make it impossible to grow the single crystal without dislocations. The temperature at the crucible wall, as well as the melting time, should therefore be minimised.

SUMMARY OF THE INVENTION

The invention relates to a process for melting semiconductor material in a crucible which is located in a container and is enclosed by a fixed heating device. In this case, the heater of a displaceable heating device is lowered from a lock chamber above the container through an open shut-off valve into the container in the direction of the semiconductor material. In addition, the semiconductor material is melted using the fixed heating device and the lowered heater, and the heater is raised back out of the container into the lock chamber after the semiconductor material has been melted.

The invention also relates to a heating device which is suitable for carrying out the process. A heating device is proposed which is displaceable and comprises a heater which can be lowered from a lock chamber above the container. Next, the heater is lowered through an open shut-off valve into the container in the direction of the semiconductor material, and raised back into the lock chamber.

The invention permits rapid melting of the semiconductor material starting from the center of the semiconductor material charge. The crucible material is protected since a substantial proportion of the required energy is not introduced through the crucible wall. Furthermore, the process does not have any effect on the procedure involved in the actual crystal production, so that tried and tested pull conditions can be kept unchanged.

One object of the invention is to provide a moveable heating device for melting semiconductor material.

Another object of the invention is to provide a heating device to carry out the Czochralski system for forming single crystals from a semiconductor material.

Another object of the invention is to provide a heating device for melting semiconductor material that is simple in design, inexpensive to manufacture, and easy to operate.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

FIG. 1 shows a cross-sectional view of the device for melting semiconductor material.

DETAILED DESCRIPTION OF PREFERRED EMBODIMENTS

In the FIGURE, a crucible 2, filled with semiconductor material 1, is located in a container 3 which may be flushed with inert gas and evacuated. A fixed heating device 4 encloses the crucible. If appropriate, an additional fixed heating device may further be provided which is arranged under the bottom of the crucible and is referred to as a bottom heater. Above the crucible, a lock chamber 5 is flanged onto the container. It accommodates a displaceable heating device having a heater 6 whose front side is directed at the semiconductor material and whose rear side is insulated by thermal insulation 7. The heater comprises two heating elements, which are mounted on the ends of a tube 8 and a shaft 9. The heater is preferably designed in the form of an electrical heating resistor or induction heater, and is made of graphite. The required electric current can be either direct current or alternating current, or direct current modulated with alternating-current components. This current is preferably delivered via tube 8 and shaft 9. Tube 8 and shaft 9 can be raised and lowered together axially. The gap between tube 8 and shaft 9 is used for delivering inert gas to the container 3, or for discharging waste gas from the container. The device further comprises a bell 10 which can be evacuated and flushed with inert gas, and is placed over insulation 7 and heater 6. Bell 10 is supported on a support plate 11 of the lock chamber 5. Vacuum-tight seals 12 between the bell and the support plate, and between bell 10 and the tube 8, form a gas-tight barrier. The interior of the container can be separated in gas-tight fashion from the interior of the lock chamber using a shut-off valve 13.

To melt the semiconductor material, bell 10 is evacuated and flushed with inert gas, and shut-off valve 13 is opened. Tube 8 and shaft 9 are lowered until heater 6 has reached a position as close as possible to the surface of the semiconductor material. The distance between the surface of heater 6 and the surface of the semiconductor material is sufficiently large to exclude the possibility of contact with the semiconductor material to be melted. The heater is preferably designed so that it fits into a tubular or conical heat shield 14. If the latter is built into the container, then it is suspended over crucible 2. The energy for melting the semiconductor material is applied by the combination of fixed heating device 4, a bottom heater which may be present, and the lowered heater 6. It is preferable to distribute the energy contributions in such a way that the semiconductor material melts as a function of its position in the crucible, and semiconductor material which is in contact with the crucible wall melts last. It is also preferable if the front of the molten semiconductor material moves radially outward from the middle of the crucible toward the crucible wall, and if the melting procedure is observed from a position above the crucible.

After the semiconductor material has been melted, heater 6 is raised back into the lock chamber, and shut-off valve 13 is closed. The heating device is then removed from the lock chamber through door 15. The single crystal is then pulled by lowering a seed crystal using a conventional pulling device which is disposed above the lock chamber (not shown in the FIGURE). Next it is pulled through the lock chamber wherein it is evacuated and flushed with inert gas, if appropriate, and then sent to the surface of the molten semiconductor material.

As an alternative to the procedure described above, the displaceable heating device with the lock chamber may be removed from the container, and moved to another container. Next, a pulling device is put in place of the lock chamber that has been removed.

Accordingly, while a few embodiments of the present invention have been shown and described, it is to be understood that many changes and modifications may be made thereunto without departing from the spirit and scope of the invention as defined in the appended claims.

What is claimed is:

1. A process for melting semiconductor material in a crucible that is located in a container and is enclosed by a fixed heating device comprising the steps of:

lowering a moveable heater from a lock chamber, disposed ab the container through an open shut-off valve into the container the direction of the semiconductor material;

melting the semiconductor material using the fixed heating device and said lowered moveable heater;

moving a front portion of molten semiconductor material radially outward from the middle region of the crucible toward a crucible wall; and raising the moveable heater back out of the container into t lock chamber after the semiconductor material has been melted.

2. The process as claimed in claim 1, wherein the moveable heating device is removed through a door disposed in the lock chamber after the semiconductor material has been melted.

3. The process as claimed in claim 1, wherein the semiconductor material is melted as a function of its position in the crucible, and semiconductor material that is in contact with the crucible is melted last.

* * * * *